(12) United States Patent
Yeduru et al.

(10) Patent No.: US 12,211,920 B2
(45) Date of Patent: Jan. 28, 2025

(54) BACKSIDE OHMIC CONTACTS FOR SEMICONDUCTOR DEVICES

(71) Applicant: SEMICONDUCTOR COMPONENTS INDUSTRIES, LLC, Phoenix, AZ (US)

(72) Inventors: Srinivasa Reddy Yeduru, Fishkill, NY (US); Naveen Ganagona, Fishkill, NY (US); George Chang, Tempe, AZ (US); Byoungyong Park, Bucheon (KR); Soonjae Lee, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 396 days.

(21) Appl. No.: 17/658,771

(22) Filed: Apr. 11, 2022

(65) Prior Publication Data
US 2022/0328643 A1     Oct. 13, 2022

Related U.S. Application Data

(60) Provisional application No. 63/174,429, filed on Apr. 13, 2021.

(51) Int. Cl.
*H01L 29/45* (2006.01)
*H01L 21/265* (2006.01)
*H01L 21/285* (2006.01)
*H01L 21/304* (2006.01)
*H01L 21/306* (2006.01)

(52) U.S. Cl.
CPC ........ *H01L 29/45* (2013.01); *H01L 21/26513* (2013.01); *H01L 21/28568* (2013.01); *H01L 21/304* (2013.01); *H01L 21/30604* (2013.01)

(58) Field of Classification Search
CPC .............. H01L 29/45; H01L 21/26513; H01L 21/28568; H01L 21/304; H01L 21/30604; H01L 29/045; H01L 21/268; H01L 29/456; H01L 21/28512; H01L 21/2855; H01L 29/04
See application file for complete search history.

(56) References Cited

U.S. PATENT DOCUMENTS 6,803,243 B2 * 10/2004 Slater, Jr. ........ H01L 31/022408
257/E21.057
10,600,921 B2 * 3/2020 Ohse .................. H01L 29/8725
(Continued)

FOREIGN PATENT DOCUMENTS

DE     102006053182 A1     5/2008
DE     102009036930 A1     3/2010
(Continued)

*Primary Examiner* — David Vu
(74) *Attorney, Agent, or Firm* — Brake Hughes Bellermann LLP

(57) ABSTRACT

In some aspects, the techniques described herein relate to a semiconductor device including: a substrate having a first side and a second side, the second side being opposite the first side; active circuitry disposed on the first side of the substrate; a metallic implant disposed in the substrate, the metallic implant being a blanket implant on the second side of the substrate; and a metallic layer disposed on the second side of the substrate, the metallic layer and the second side of the substrate including the metallic implant defining an ohmic contact.

21 Claims, 2 Drawing Sheets

(56) References Cited

U.S. PATENT DOCUMENTS

| | | |
|---|---|---|
| 2004/0171204 A1 | 9/2004 | Slater, Jr. et al. |
| 2012/0125259 A1 | 5/2012 | Adibi et al. |
| 2017/0054008 A1 | 2/2017 | Muramatsu et al. |
| 2020/0249198 A1 | 8/2020 | Mohanty |

FOREIGN PATENT DOCUMENTS

| | | |
|---|---|---|
| DE | 102019102371 A1 | 7/2020 |
| JP | 2007013087 A | 1/2007 |
| JP | 2007194283 A | 8/2007 |

\* cited by examiner

BACKSIDE OHMIC CONTACTS FOR SEMICONDUCTOR DEVICES

CROSS-REFERENCE TO RELATED APPLICATION

This application claims priority to and the benefit of U.S. Provisional Application No. 63/174,429, filed Apr. 13, 2021, entitled "SEMICONDUCTOR DEVICES AND METHODS", which is hereby incorporated by reference in its entirety.

TECHNICAL FIELD

This description relates to semiconductor devices. More specifically, this description relates to approaches for implementing backside ohmic contacts for semiconductor devices.

BACKGROUND

Manufacturing of semiconductor wafers includes a number of processing operations. These operations can include front-end operations and back-end operations. Front-end operations can include, for instance, operations used to form individual devices (e.g., transistors, capacitors, resistors, etc.) in a semiconductor wafer, while back-end operations can include operations used to form layers on the semiconductor wafer, such as metal layers to interconnect the individual devices formed during front-end processing, as well as to form a backside contact, e.g., an ohmic contact, where the backside contact is formed on a surface, or side of the semiconductor wafer that is opposite a side and/or surface of the semiconductor wafer including the interconnected individual devices.

Current approaches for forming backside contacts include depositing, e.g., using sputtering processes, one or more metallic materials, in one or more layers, on the backside of a semiconductor wafer being processed. These current processes, however, have a number of drawback, such as the need for wet chemistry etch process to prepare the backside surface of the semiconductor wafer for contact formation, and poor sputtered metal layer adhesion (and resulting high contact resistance) due to oxidation of the semiconductor wafer during a time period between preparation of the backside surface and metal deposition (which limits that time period, and in turn manufacturing process flexibility). Further, quality of, e.g., resistance of, such backside contacts can also be affected by process stability issues due to sputtering target variability issues, particularly a first metallic material applied to the backside of the semiconductor wafer. Such high backside contact resistance can result in circuit elements included in a corresponding semiconductor failing to meet expect performance parameters. For instance, for semiconductor devices including power transistors, such high contact resistance adversely affect their on-state performance (e.g., collector-to-emitter saturation voltage above a desired value for insulated-gate bipolar transistors, drain-to-source on resistance for metal-oxide-semiconductor field-effect transistors, etc.).

SUMMARY

In some aspects, the techniques described herein relate to a semiconductor device including: a substrate having a first side and a second side, the second side being opposite the first side; active circuitry disposed on the first side of the substrate; a metallic implant disposed in the substrate, the metallic implant being a blanket implant on the second side of the substrate; and a metallic layer disposed on the second side of the substrate, the metallic layer and the second side of the substrate including the metallic implant defining an ohmic contact.

In some aspects, the techniques described herein relate to a semiconductor device, wherein the substrate is a silicon substrate.

In some aspects, the techniques described herein relate to a semiconductor device, wherein the metallic implant includes aluminum.

In some aspects, the techniques described herein relate to a semiconductor device, wherein the metallic implant further includes at least one of gold, nickel, platinum, palladium, silver, or copper.

In some aspects, the techniques described herein relate to a semiconductor device, wherein the active circuitry includes a power transistor.

In some aspects, the techniques described herein relate to a semiconductor device, wherein the metallic layer includes at least one of nickel vanadium, titanium, or silver.

In some aspects, the techniques described herein relate to a semiconductor device, wherein the metallic implant has an average depth of less than or equal to 10 micrometers.

In some aspects, the techniques described herein relate to a semiconductor device, wherein the metallic implant includes a plurality of metallic spikes with respective depths greater than the average depth.

In some aspects, the techniques described herein relate to a semiconductor device, wherein the metallic implant compressively strains the substrate.

In some aspects, the techniques described herein relate to a method for producing a semiconductor device including: producing active circuitry on a first side of a semiconductor substrate; performing a blanket metallic implant on a second side of the semiconductor substrate, the second side of being opposite the first side; and forming a metallic layer on the second side of the semiconductor substrate, the metallic layer and the second side of the semiconductor substrate including the blanket metallic implant defining an ohmic contact.

In some aspects, the techniques described herein relate to a method, wherein the method further includes: prior to performing the blanket metallic implant: grinding the second side of the semiconductor substrate; performing a silicon etch on the second side of the semiconductor substrate; performing an impurity implant on the second side of the semiconductor substrate; and performing a laser anneal on the second side of the semiconductor substrate.

In some aspects, the techniques described herein relate to a method, wherein the method further includes: prior to performing the blanket metallic implant, performing an impurity implant on the second side of the semiconductor substrate; and after performing the blanket metallic implant, performing a laser anneal on the second side of the semiconductor substrate.

In some aspects, the techniques described herein relate to a method, wherein the semiconductor substrate is a silicon substrate.

In some aspects, the techniques described herein relate to a method, wherein performing the blanket metallic implant includes implanting aluminum.

In some aspects, the techniques described herein relate to a method, wherein performing the blanket metallic implant further includes implanting at least one of gold, nickel, platinum, palladium, silver, or copper.

In some aspects, the techniques described herein relate to a method, wherein producing the active circuitry includes producing a power transistor.

In some aspects, the techniques described herein relate to a method, wherein the metallic layer includes at least one of nickel vanadium, titanium, or silver.

In some aspects, the techniques described herein relate to a method, wherein the blanket metallic implant has an average depth, in the semiconductor substrate, of less than or equal to 10 micrometers.

In some aspects, the techniques described herein relate to a method, wherein performing the blanket metallic implant includes forming a plurality of metallic spikes with respective depths in the semiconductor substrate greater than the average depth.

In some aspects, the techniques described herein relate to a method, wherein performing the blanket metallic implant includes at least one of: heating the semiconductor substrate to a temperature between 250 degrees Celsius and 450 degrees Celsius; or heating an implanted metallic material to a temperature between 250 degrees Celsius and 450 degrees Celsius.

Figure 1:
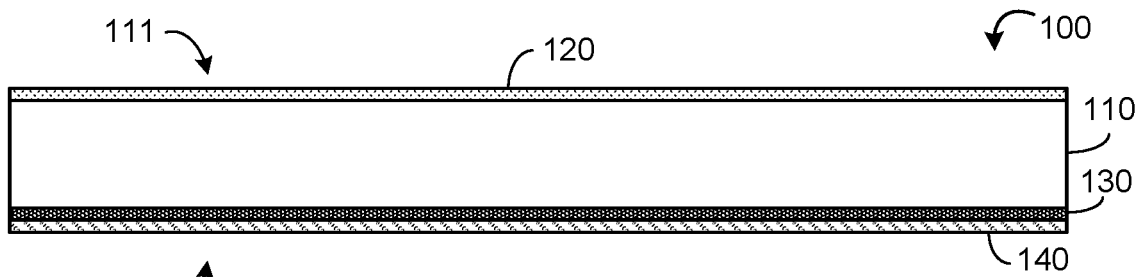
FIG. 1 is a diagram schematically illustrating an example semiconductor device, in accordance with an embodiment.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

This application is directed to devices and processes for forming an Ohmic backside contact for semiconductor devices, such as during semiconductor wafer processing, e.g. back-end wafer processing. The approaches described herein include performing a metallic implant on a backside of a semiconductor wafer, where that metallic implant can facilitate formation of a low-resistance silicon-metal alloy backside ohmic contact, such as by performing the metallic implant at high temperature (e.g., by heating the semiconductor wafer and/or by heating implanted metallic material (e.g., metal ions). Additionally, backside metal layers can then be disposed on (as part of) the backside ohmic contact to produce a low-resistance backside contact that can achieve and/or improve operation of associated circuitry. For instance, such approaches can, as compared to current approaches, improve (reduce) collector-to-emitter saturation voltage ($V_{cesat}$) for insulated-gate bipolar transistors (IG-BTs), and/or improve (reduce) drain-to-source on resistance ($R_{dson}$) for metal-oxide-semiconductor field-effect transistors included in the semiconductor device. In some implementations, the backside contact can be used to couple the semiconductor die to a die attach paddle of a leadframe, a die attach pad of a substrate, etc.

The approaches described herein can also overcome at least some of the drawbacks of current approaches described above. For example, use of such a metallic implant can inhibit oxidation of a corresponding semiconductor wafer (e.g., a silicon wafer), allowing for longer time periods between preparation of the wafer for backside contact formation and application of backside metallization, thus increasing flexibility during semiconductor manufacturing. The approaches described herein can also allow for omitting a wet chemistry etch of the semiconductor wafer prior to formation of the backside contact, which can have process control issues, and for omitting a sputtering operation (initial sputtering operation) for ohmic contact formation. The disclosed approaches can also improve process control of backside contact resistance, as compared to current approaches, through selection of a metallic implant dose and an associated implant energy.

FIG. 1 is a diagram schematically illustrating an example semiconductor device 100. In example implementations, the semiconductor device 100 can be produced, along with other semiconductor devices, on a semiconductor wafer (e.g., a silicon wafer, a silicon carbide wafer, etc.). As shown in FIG. 1, the semiconductor device 100 includes a semiconductor substrate 110 (e.g., a portion of a semiconductor wafer), and active circuitry 120 formed in and/or on a side 111 of the semiconductor substrate 110. The semiconductor device 100 also includes an ohmic contact 130 formed in the substrate 110, e.g., on a side 112, opposite the side 111, a metallic layer 140 disposed on the ohmic contact 130.

In the semiconductor device 100, the active circuitry 120 can include one or more individual devices (e.g., transistors, capacitors, resistors, etc.) formed in the semiconductor substrate 110, as well as interconnection layers formed on the semiconductor substrate 110, where the interconnection layers provide electrical connections to the individual devices. For instance, in some implementations, the active circuitry 120 can include a power transistor, such as an IGBT or a MOSFET, as well as electrical connections to terminals of the power transistor. For purposes of clarity and brevity, the specifics of such circuitry are not described herein.

In example implementations, the ohmic contact 130 can be defined using one or more implants. For instance, forming the ohmic contact 130 can include performing a semiconductor doping impurity implant, such as an implant including one or more of boron, phosphorous, arsenic, etc. The particular impurity or impurities used can depend on the specific implementation. The ohmic contact 130 can also include a metallic implant, including one or more of aluminum, gold, nickel, platinum, palladium, silver, and/or copper. In some implementations, the metallic implant can form an alloy with the semiconductor substrate 110. For instance, in an example implementation of the semiconductor device 100, the semiconductor substrate 110 can be a silicon substrate that is implanted with aluminum. As silicon can dissolve in aluminum, in this example, the ohmic contact 130 can include a silicon-aluminum alloy. In some implementations, the impurity and metallic implants used to define the ohmic contact 130 can be blanket implants that are performed over an entire side (surface) of a semiconductor wafer including the semiconductor device 100 (e.g., performed on the side 112 of the semiconductor substrate 110).

As shown in FIG. 1, the semiconductor device 100 can further include the metallic layer 140, which is disposed on (deposited on) the ohmic contact 130. The metallic layer 140 can include one or more metallic materials, formed in one or more layers, that are deposited on the ohmic contact 130 using metal sputtering. In some implementations, the metallic layer 140 can include one or more of nickel vanadium, titanium, and/or silver. The ohmic contact 130, in combination with the metallic layer 140 can provide a low-resistance backside contact (ohmic contact) for the semiconductor device 100 that can achieve both the performance advantages and semiconductor manufacturing process advantages described herein.

Figure 2A:
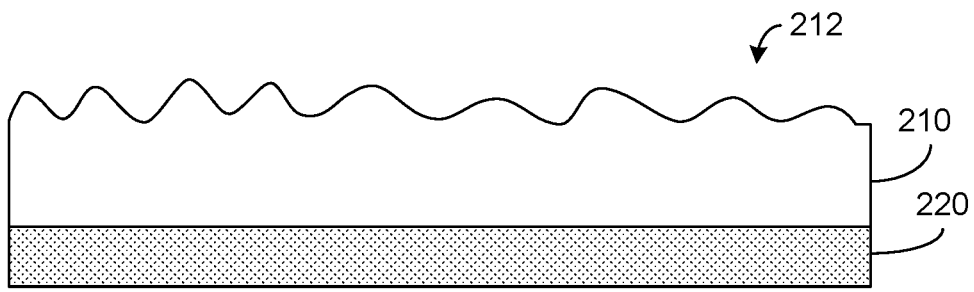
FIGS. 2A to 2C are diagrams illustrating an example process for producing an ohmic contact.
Figure 2B:
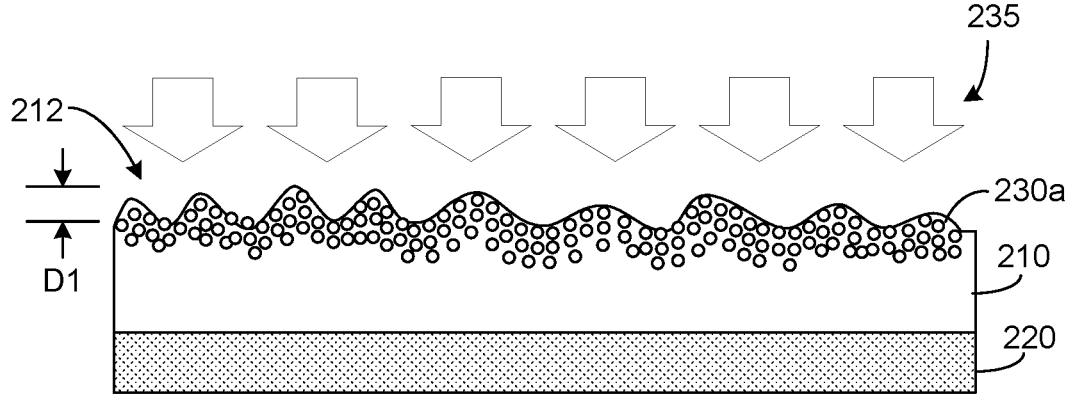
Figure 2C:
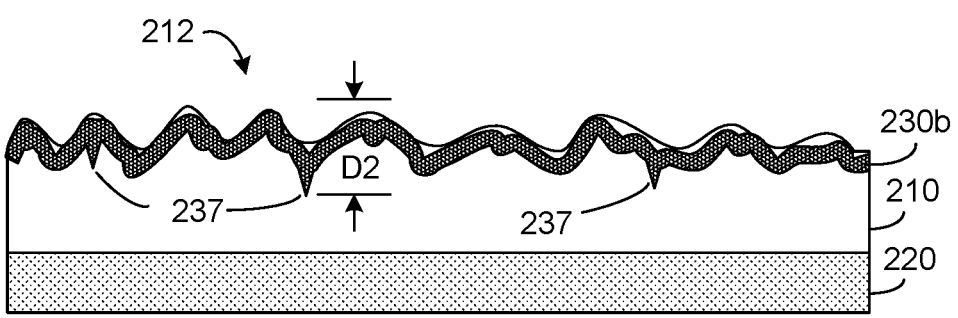

FIGS. 2A to 2C are diagrams schematically illustrating an example process for forming a backside ohmic contact in a semiconductor substrate 210 (e.g., a semiconductor wafer). In some implementations, the process illustrated by FIGS. 2A to 2C (as well as the methods illustrated in FIGS. 3 and 4 discussed below) can be used to produce an ohmic contact, such as the ohmic contact 130 of the semiconductor device 100 in FIG. 1. As compared to FIG. 1, the orientation of the semiconductor substrate 210 is inverted from the orientation of the semiconductor substrate 110. That is, a side 212 in which an ohmic contact is formed is the upper side of the semiconductor substrate 210 in FIG. 2, as opposed to the side 111 of the semiconductor substrate 110 being illustrated as the lower side in FIG. 1.

Referring to FIG. 2A, the semiconductor substrate 210 can include active circuitry 220, which can be produced prior to formation of an ohmic contact in the semiconductor substrate 210. As shown in FIG. 2A, as well as in FIGS. 2B and 2C, the substrate 210 can have an irregular (rough, etc.) surface on the side 212. This irregular surface can be a result of a grinding operation that is performed to thin the semiconductor substrate 210 to a desired thickness. In some implementations, a substrate etch can be performed after the grinding operation to remove defects, such as dislocations, in a crystalline structure of the semiconductor substrate 210. In this example, the irregular surface of the 210 on the side 212 increases an effective surface area, as compared to a planar surface, for ohmic contact formation, which contributed to reducing overall backside contact resistance.

Referring to FIG. 2B, an implant layer 230a can be formed in the semiconductor substrate 210. For instance, the implant layer 230a can include a semiconductor impurity implant and a metallic implant, such as described herein. In this example, the implant layer 230a is formed using a plurality of implant operations 235. That is a first implant operation 235 can be performed to implant the semiconductor impurity (or impurities), while a second implant can be performed to implant one or more metallic materials (e.g., aluminum, gold, nickel, platinum, palladium, silver, and/or copper). As shown in FIG. 2B, the implant layer 230a can have an average depth D1. The average depth D1 can depend, at least in part, on an energy of an ion beam used to implant the metallic material(s) and an implant dose of the metallic materials. In some implementations an ion beam with an energy between 10 and 500 keV can be used, with an implant metallic material dose between $1\times10^{14}$/cm2 and $5\times10^{16}$/cm2. In some implementations, the average depth D1 can be in a range of 0.1 um to 10 um.

Referring now to FIG. 2C, in this example, the implant layer 230a of FIG. 2C can define an ohmic contact 230b in the semiconductor substrate 210. For instance, as discussed, above, the implanted portion of the substrate 210 (e.g., silicon) can form an alloy with at least a portion of the one or more implanted metallic materials (e.g., aluminum), which, along with the semiconductor impurity implant, can define the ohmic contact 230b.

In some implementations, heat (e.g., in a temperature range of 250 to 450 degrees Celsius) can be applied either during and/or after performing the metallic implant of the ohmic contact 230b. For instance, in some implementations, an anneal operation (e.g., laser anneal, oven anneal, etc.) can be performed after the metallic implants. In other implementations, the semiconductor substrate 210 and or the implanted metallic material(s) can be heated during the metallic implant. Such application of heat can provide a number of benefits, such as repairing implant damage, forming metallic spikes 237, and/or compressively straining the crystalline structure of the semiconductor substrate 210. In some implementations, applying heat during the metallic implant can allow for omitting a post implant anneal operation, as resultant implant damage is reduced and/or repaired as a result of the heat applied during performance of the metallic implant.

In this example, the metallic spikes 237 can be formed as a result of applied heat causing the implanted metallic material to be driven into openings (holes) in the crystalline structure of the 210. The metallic spikes 237 can contribute to reducing resistance of the ohmic contact 230b. As shown in FIG. 2C, the metallic spikes 237 can have respective depths, such as depth D2, that are greater than the average depth D1 of the implant layer 230a, where the average depth D1 of FIG. 2B is shown for reference purposes in FIG. 2C. Further, compressively straining the lattice can further reduce resistance of backside contacts and improve performance of devices included in the active circuitry 220. For instance, such compressive strain can achieve a twenty percent improvement (reduction) in $V_{cesat}$ for an IGBT, or $R_{dson}$ for a MOSFET. While not shown in FIG. 2, one or more metallic layers of a backside contact, such as the metallic layer 140, can then be formed (deposited, sputtered, etc.) on the ohmic contact 230b.

Figure 3:
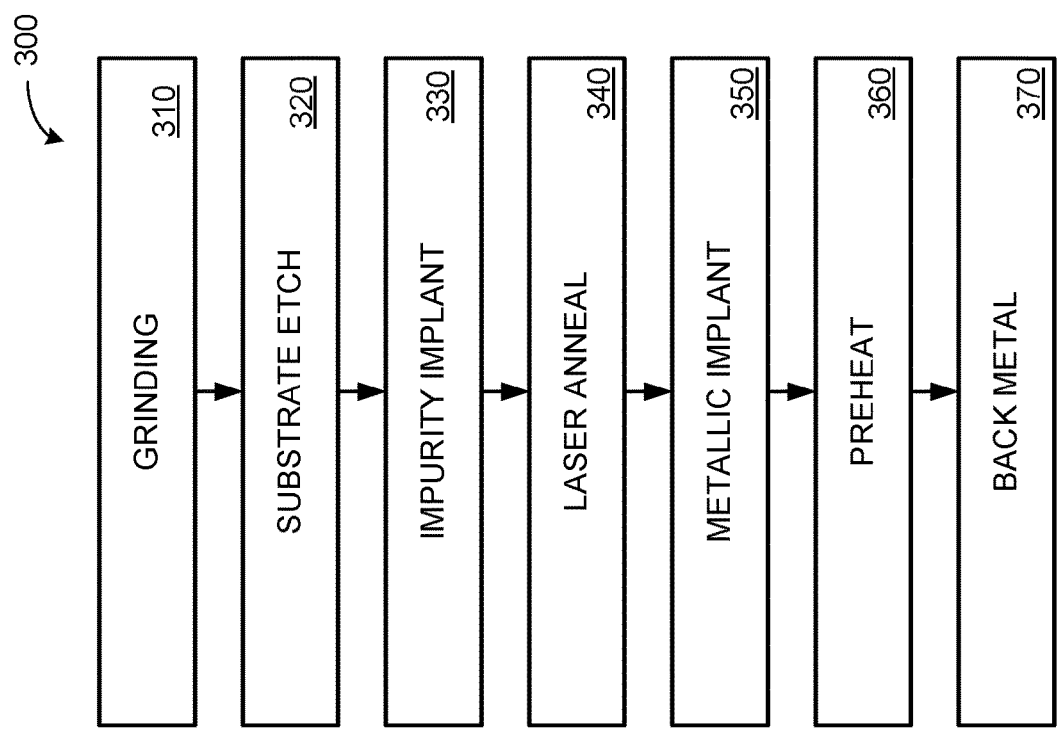
FIG. 3 is a flowchart illustrating an example method for producing a backside contact for a semiconductor device.

FIG. 3 is a flowchart illustrating an example method 300 for forming a backside contact. In some implementations, the method 300 can be used, in conjunction with other semiconductor processing operations, to produce the semiconductor device 100 of FIG. 1 and/or the ohmic contact 230a, 230b of FIGS. 2A-2C. In some implementations, operations of the method 300 can be added, omitted and/or replaced with other operations. For instance, as discussed above, applying heat during a metallic implant operation can allow for omitting a post implant anneal operation. As another example, laser anneal operations can be replaced with furnace anneal operations.

The method 300, at block 310, includes performing a grinding operation to thin a semiconductor wafer (substrate) to a desired thickness. At block 320, the method 300 includes a substrate etch operation (e.g., a plasma etch, dry etch, wet etch, etc.) to remove damage from the grinding operation at block 310. At block 330, the method 300 includes performing a semiconductor impurity implant and, at block 340, performing a laser anneal operation to repair implant damage from the impurity implant at block 330.

At block 350, the method 300 includes performing a metallic material implant for forming an ohmic contact. In this example, heat can be applied during the implant of block 350, allowing for an anneal operation after the metallic implant to be omitted. At block 360, the method 300 includes a pre-heat operation for backside metallization application (e.g., heating at 350 degrees Celsius for approximately 30 seconds) and, at block 370, depositing (e.g., sputtering) backside metallization layers, such as the metallic layer 140 of FIG. 1, on the ohmic contact formed at block 350.

Figure 4:
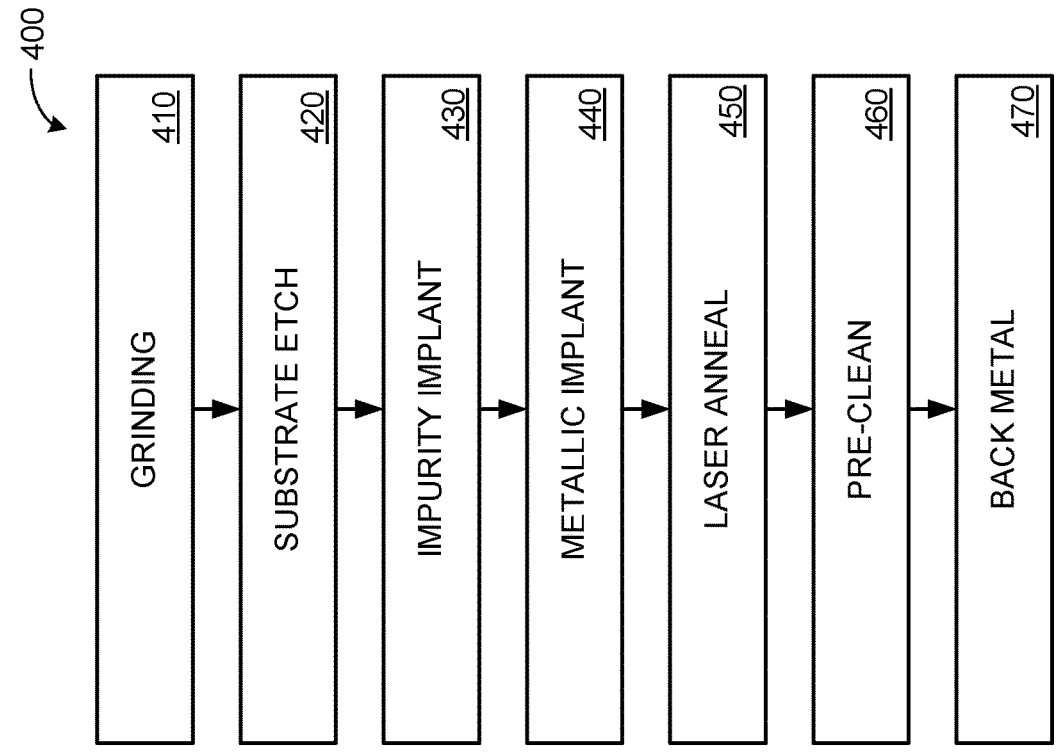
FIG. 4 is a flowchart illustrating another example method for producing a backside contact for a semiconductor device.

FIG. 4 is a flowchart illustrating another example method 400 for forming a backside contact. As with the method 300, in some implementations, the method 400 can be used, in conjunction with other semiconductor processing operations, to produce the semiconductor device 100 of FIG. 1 and/or the ohmic contact 230*a*, 230*b* of FIGS. 2A-2C. In some implementations, operations of the method 400 can be added, omitted and/or replaced with other operations. For instance, as discussed above, applying heat during a metallic implant operation can allow for omitting a post implant anneal operation. As another example, laser anneal operations can be replaced with furnace anneal operations.

The method 400, at block 410, includes performing a grinding operation to thin a semiconductor wafer (substrate) to a desired thickness. At block 420, the method 400 includes a substrate etch operation (e.g., a plasma etch, dry etch, wet etch, etc.) to remove damage from the grinding operation at block 410.

At block 430, the method 400 includes performing a semiconductor impurity implant and, at block 440, performing a metallic material implant for forming an ohmic contact. At block 450, the method 400 includes performing a laser anneal operation to repair implant damage from the impurity implant at block 430 and the metallic implant at block 440. In this example, heat may not be applied during the metallic implant 450. At block 460, the method 400 includes a pre-clean operation prior to backside metallization application and, at block 470, depositing (e.g., sputtering or evaporating) backside metallization layers, such as the metallic layer 140 of FIG. 1, on the ohmic contact formed at block 440 and/or block 450.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device comprising:
   a substrate having a first side and a second side, the second side being opposite the first side;
   active circuitry disposed on the first side of the substrate;
   an ohmic contact including:
   a metallic implant disposed in the substrate, the metallic implant being a blanket implant on the second side of the substrate; and
   a metallic layer disposed on the second side of the substrate.

2. The semiconductor device of claim 1, wherein the substrate is a silicon substrate.

3. The semiconductor device of claim 1, wherein the metallic implant includes aluminum.

4. The semiconductor device of claim 3, wherein the metallic implant further includes at least one of gold, nickel, platinum, palladium, silver, or copper.

5. The semiconductor device of claim 1, wherein the active circuitry includes a power transistor.

6. The semiconductor device of claim 1, wherein the metallic layer includes at least one of nickel vanadium, titanium, or silver.

7. The semiconductor device of claim 1, wherein the metallic implant has an average depth of less than or equal to 10 micrometers.

8. The semiconductor device of claim 7, wherein the metallic implant includes a plurality of metallic spikes with respective depths greater than the average depth.

9. The semiconductor device of claim 1, wherein the metallic implant compressively strains the substrate.

10. The semiconductor device of claim 1, wherein the blanket implant is a first blanket implant, the semiconductor device further comprising an impurity implant disposed in the substrate, the impurity implant being a second blanket implant on the second side of the substrate.

11. A method for producing a semiconductor device comprising:
    producing active circuitry on a first side of a semiconductor substrate; and
    forming an ohmic contact including:
    performing a blanket metallic implant to form an ohmic contact on a second side of the semiconductor substrate, the second side being opposite the first side; and
    forming a metallic layer on the second side of the semiconductor substrate.

12. The method of claim 11, wherein the method further comprises:
    prior to performing the blanket metallic implant:
    grinding the second side of the semiconductor substrate;

performing a silicon etch on the second side of the semiconductor substrate;

performing an impurity implant on the second side of the semiconductor substrate; and performing an anneal on the second side of the semiconductor substrate.

13. The method of claim 11, wherein the method further comprises:

prior to performing the blanket metallic implant, performing an impurity implant on the second side of the semiconductor substrate; and after performing the blanket metallic implant, performing an anneal on the second side of the semiconductor substrate.

14. The method of claim 11, wherein the semiconductor substrate is a silicon substrate.

15. The method of claim 11, wherein performing the blanket metallic implant includes implanting aluminum.

16. The method of claim 15, wherein performing the blanket metallic implant further includes implanting at least one of gold, nickel, platinum, palladium, silver, or copper.

17. The method of claim 11, wherein producing the active circuitry includes producing a power transistor.

18. The method of claim 11, wherein the metallic layer includes at least one of nickel vanadium, titanium, or silver.

19. The method of claim 11, wherein the blanket metallic implant has an average depth, in the semiconductor substrate, of less than or equal to 10 micrometers.

20. The method of claim 19, wherein performing the blanket metallic implant includes forming a plurality of metallic spikes with respective depths in the semiconductor substrate greater than the average depth.

21. The method of claim 11, wherein performing the blanket metallic implant includes at least one of:

heating the semiconductor substrate to a temperature between 250 degrees Celsius and 450 degrees Celsius; or heating an implanted metallic material to a temperature between 250 degrees Celsius and 450 degrees Celsius.

\* \* \* \* \*